(12) United States Patent
Schier

(10) Patent No.: US 7,670,674 B2
(45) Date of Patent: *Mar. 2, 2010

(54) PVD COATED CUTTING TOOL

(75) Inventor: Veit Schier, Echterdingen (DE)

(73) Assignee: Sandvik Intellectual Property AB, Sandviken (SE)

( * ) Notice: Subject to any disclaimer, the term of this patent is extended or adjusted under 35 U.S.C. 154(b) by 707 days.

This patent is subject to a terminal disclaimer.

(21) Appl. No.: 11/513,405

(22) Filed: Aug. 31, 2006

(65) Prior Publication Data

US 2007/0059559 A1  Mar. 15, 2007

(30) Foreign Application Priority Data

Sep. 9, 2005   (SE) .................................... 0502001
Sep. 12, 2005  (SE) .................................... 0502009

(51) Int. Cl.
    *B32B 9/00* (2006.01)
(52) U.S. Cl. .................... 428/216; 51/307; 51/309; 204/192.1; 204/192.15; 407/119; 427/348; 427/368; 427/419.1; 427/419.2; 427/419.3; 427/419.7; 428/156; 428/178; 428/336; 428/472; 428/697; 428/698; 428/699; 428/701; 428/702
(58) Field of Classification Search .................... 51/307, 51/309; 428/156, 174, 216, 336, 472, 697, 428/698, 699, 701, 702; 407/119; 204/192.1, 204/192.15; 427/348, 368, 419.1, 419.2, 427/419.3, 419.7
See application file for complete search history.

(56) References Cited

U.S. PATENT DOCUMENTS

| | | | |
|---|---|---|---|
| 4,746,563 A * | 5/1988 | Nakano et al. ............... 428/216 |
| 5,310,607 A | 5/1994 | Schulz et al. |
| 5,861,210 A * | 1/1999 | Lenander et al. ............ 428/702 |
| 5,863,640 A | 1/1999 | Ljungberg et al. |
| 5,879,823 A | 3/1999 | Prizzi et al. |
| 6,062,776 A | 5/2000 | Sandman et al. |
| 6,210,726 B1 | 4/2001 | Schiller et al. |
| 6,214,287 B1 * | 4/2001 | Waldenstrom ............... 75/240 |
| 6,250,855 B1 * | 6/2001 | Persson et al. ............. 428/216 |
| 6,273,930 B1 * | 8/2001 | Waldenstrom ............... 75/240 |
| 6,333,099 B1 * | 12/2001 | Strondl et al. ............... 428/216 |
| 6,342,291 B1 | 1/2002 | Jonsson et al. |
| 6,565,957 B2 * | 5/2003 | Nakamura et al. .......... 428/216 |
| 6,632,514 B1 * | 10/2003 | Sulin et al. .................. 428/701 |
| 6,682,274 B2 | 1/2004 | Votsch et al. |
| 6,689,450 B2 * | 2/2004 | Ruppi ........................ 428/698 |
| 6,720,095 B2 * | 4/2004 | Ruppi et al. ................ 428/702 |
| 6,884,497 B2 * | 4/2005 | Sulin et al. .................... 51/307 |
| 7,094,479 B2 * | 8/2006 | Sato et al. ................... 428/336 |
| 7,153,562 B2 * | 12/2006 | Rodmar et al. ............. 428/701 |
| 7,163,735 B2 * | 1/2007 | Ruppi ........................ 428/698 |
| 2007/0059558 A1 | 3/2007 | Schier |

FOREIGN PATENT DOCUMENTS

EP  1 193 328  4/2002

OTHER PUBLICATIONS

Sukehiro Shinzato et al., "Internal Stress in Sputter-Deposited $Al_2O_3$ Films", Thin Solid Films, 97, 1982, pp. 333-337.

O. Knotek et al., "Process and Advantage of Multicomponent and Multilayer PVD Coatings", Surface and Coatings Technology, 59, 1993, pp. 14-20.

* cited by examiner

*Primary Examiner*—A. A. Turner
(74) *Attorney, Agent, or Firm*—Drinker Biddle & Reath LLP

(57) ABSTRACT

There is described a cutting tool with improved properties for metal machining having a substrate of cemented carbide and a hard and wear resistant coating on the surface of said substrate. The coating is deposited by Physical Vapor Deposition (PVD). The coating is composed of metal nitrides in combination with alumina ($Al_2O_3$). The coating is composed of a laminar multilayered structure. The insert is further treated to have different outer layers on the rake face, and flank face respectively.

20 Claims, No Drawings

PVD COATED CUTTING TOOL

BACKGROUND OF THE INVENTION

The present invention relates to a cutting tool with improved properties for metal machining having a substrate of cemented carbide and a hard and wear resistant coating on the surface of said substrate. The coating is deposited by Physical Vapor Deposition (PVD). The coating is composed of metal nitrides in combination with alumina ($Al_2O_3$). The coating is composed of a laminar multilayered structure. In order to optimize performance, the insert is further treated to have different outer layers on the rake face and flank face, respectively.

Modem high productivity tools for chip forming machining of metals require reliable tools with excellent wear properties. Since the end of 1960s it is known that tool life can be significantly improved by applying a suitable coating to the surface of the tool. The first coatings for wear applications were made by Chemical Vapor Deposition (CVD) and this coating technique is still widely used for cutting tool applications. Physical Vapor Deposition (PVD) was introduced in the mid 1980s and has since then been further developed from single coatings of stable metallic compounds like TiN or Ti(C,N) to include multicomponent and multilayer coatings also including metastable compounds like (Ti,Al)N or non metallic compounds like $Al_2O_3$.

RF-sputtering of alumina on cemented carbide cutting tools using deposition temperatures up to 900° C. is described in Shinzato et.al, Thin Sol. Films, 97 (1982) 333-337. The use of PVD coatings of alumina for wear protection is described in Knotek et al, Surf. Coat. Techn., 59 (1993) 14-20, where the alumina is deposited as an outermost layer on a wear resistant carbonitride layer. The alumina layer is said to minimize adhesion wear and acts as a barrier to chemical wear. U.S. Pat. No. 5,879,823 discloses a tool material coated with PVD alumina as one or two out of a layer stack, the non-oxide layers being, e.g., TiAl-containing. The tool may have an outer layer of TiN. The $Al_2O_3$ may be of alpha, kappa, theta, gamma or amorphous type. Alumina coated tools where the oxide polymorph is of gamma type with a 400 or 440 texture are disclosed in U.S. Pat. No. 6,210,726. U.S. Pat. No. 5,310,607 discloses PVD deposited alumina with a content of >5% Cr. A hardness of >20 GPa and a crystal structure of alpha phase is found for Cr contents above 20%. No Cr addition gives amorphous alumina with a hardness of 5 GPa.

Most coated tools to-day have a top layer of a goldish TiN to make it easy to differentiate by the naked eye between a used and an unused cutting edge. TiN is not always the preferred top layer especially not in applications where the chip may adhere to the TiN layer. Partial blasting of coatings is disclosed in EP-A-1193328 with the purpose to enable wear detection at the same time as the beneficial properties of the underlying coating are retained. Wear on the rake face is mostly chemical in nature and requires a chemically stable compound whereas wear on the flank face is mostly mechanical in nature and requires a harder and abrasive resistant compound.

OBJECTS AND SUMMARY OF THE INVENTION

It is an object of the present invention is to provide an improved cutting tool composition with a multilayer coating.

It is a further object of the present invention to further improve the performance of PVD coated cutting tools using the concept of different outer layers on the rake and flank face respectively.

In one aspect of the invention, there is provided a PVD coated cemented carbide insert having an upper face (rake face), an opposite face and at least one clearance face intersecting said upper and opposite faces to define cutting edges wherein the cemented carbide has a composition of from about 86 to about 90 weight % WC, from about 0.2 to about 0.8 weight % $Cr_3C_2$ and from about 10 to about 14 weight % Co, with a grain size of less than about 1.5 µm and coated with a hard layer system, having a total thickness of from about 3 to about 30 µm, comprising a first layer of (Ti,Al)N with a thickness of from about 1 to about 5 µm, an alumina layer with a thickness of from about 1 to about 4 µm, a ((Ti,Al)N+alumina)*N multilayer, where $N \geq 2$, with a thickness of less than about <0.5 µm, and a ZrN layer with a thickness of less than about 1 µm, the ZrN-layer missing on the rake face and on the edge line.

In another aspect of the invention, there is provided a method of making a coated cutting tool insert, having an upper face (rake face), an opposite face and at least one clearance face intersecting said upper and opposite faces to define cutting comprising providing a cemented carbide substrate with a composition of about 86 to about 90 weight % WC, 0.2 to about 0.8 weight % $Cr_3C_2$ and from about 10 to about 14 weight % Co, with a grain size of less than about 1.5 µm, depositing onto the cemented carbide substrate by PVD, a hard layer system with a total thickness of from about 3 to about 30 µm, and comprising a first layer of (Ti,Al)N with a thickness of from about 1 to about 5 µm, an alumina layer with a thickness of from about 1 to about 4 µm, a ((Ti,Al)N+alumina)*N multilayer, where $N \geq 2$, with a thickness of less than about 0.5 µm, and an outermost ZrN layer with a thickness of less than about 1 µm, and removing said ZrN-layer on the rake face and on the edge line by post-treatment.

DETAILED DESCRIPTION OF THE INVENTION

The coating, preferably made by PVD, has a (Ti,Al)N-compound next to the substrate, an alumina layer on top of the (Ti,Al)N-layer and at least two further alternating layers of (Ti,Al)N and alumina and an outermost layer of ZrN. The ZrN layer is removed on the rake face in a post treatment, preferably blasting or brushing. For complete removal of the ZrN coating on the rake face several repeated brushings or blastings are often necessary. An incomplete removal often results in local welding of the ZrN residuals to the chip which reduces tool life. In order to reduce the adherence of the top ZrN layer, an intermediate layer of substoichiometric $ZrN_{1-x}$ is deposited on the alumina layer, underneath the ZrN layer. The substoichiometric $ZrN_{1-x}$ has a reduced strength and facilitates the removal of the top ZrN layer.

According to the present invention, there is now provided a cutting tool insert, having an upper face (rake face), an opposite face and at least one clearance face intersecting said upper and opposite faces to define cutting edges, comprising a cemented carbide substrate and a hard layer system. The cemented carbide has a composition of from about 86 to about 90 weight % WC, from about 0.2 to about 0.8 weight % $Cr_3C_2$ and from about 10 to about 14 weight % Co, preferably from about 86 to about 87 weight % WC, from about 0.4 to about 0.6 weight % $Cr_3C_2$ and from about 11 to about 13 weight % Co with a grain size of less than about 1.5 µm, preferably less than about 1.1 µm. The hard layer system has a total thickness of from about 3 to about 30 µm, and comprises a first layer of (Ti,Al)N with a thickness of from about 1 to about 5, preferably from about 2 to about 4, μm, an alumina layer, preferably γ-alumina, with a thickness of from about 1 to about 4, preferably from about 1 to about 2, μm, a ((Ti,Al)N+alumina)*N multilayer, where N≧2, with a thickness of less than about 0.5 μm, preferably from about 0.1 to about 0.3 μm, preferably a thin, preferably less than about 0.1 μm, layer of substoichiometric $ZrN_{1-x}$, preferably x=0.01-0.1, and a ZrN layer with a thickness of less than about 1 μm, preferably from about 0.1 to about 0.6 μm, the ZrN-layer missing on the rake face and on the edge line wherein the (Ti,Al)N-layers preferably have an atomic composition of Al/Ti of greater than about 60/40 to less than about 70/30, most preferably Al/Ti is about 67/33.

The present invention also relates to a method of making a coated cutting tool insert, having an upper face (rake face), an opposite face and at least one clearance face intersecting said upper and opposite faces to define cutting edges, comprising the following steps providing a cemented carbide substrate with a composition of from about 86 to about 90 weight % WC, from about 0.2 to about 0.8 weight % $Cr_3C_2$ and from about 10 to about 14 weight % Co, preferably from about 86 to about 87 weight % WC, from about 0.4 to about 0.6 weight % $Cr_3C_2$ and from about 11 to about 13 weight % Co with a grain size of less than about 1.5 μm, preferably less than about 1.1 μm depositing onto the cemented carbide substrate, using PVD methods, a hard layer system with a total thickness of from about 3 to about 30 μm, and comprising a first layer of (Ti,Al)N with a thickness of from about 1 to about 5, preferably from about 2 to about 4, μm, an alumina layer, preferably γ-alumina, with a thickness of from about 1 to about 4, preferably from about 1 to about 2, μm, a ((Ti,Al)N+alumina)*N multilayer, where N≧2, with a thickness of less than about 0.5 μm, preferably from about 0.1 to about 0.3 μm, preferably a thin, preferably less than about 0.1 μm, layer of substoichiometric $ZrN_{1-x}$, preferably x=from about 0.01 to about 0.1 and an outermost ZrN layer with a thickness of less than about 1 μm, preferably from about 0.1 to about 0.6 μm wherein the (Ti,Al)N-layers preferably have an atomic composition of Al/Ti of greater than about 60/40 to less than about 70/30, most preferably Al/Ti is about 67/33 and removing said ZrN-layer on the rake face and on the edge line by a post-treatment, preferably by brushing or blasting.

The invention is additionally illustrated in connection with the following examples, which are to be considered as illustrative of the present invention. It should be understood, however, that the invention is not limited to the specific details of the examples.

EXAMPLE 1

Cemented carbide inserts ADMT 160608R with the composition 87.5 weight % WC, 0.5 weight % $Cr_3C_2$ and 12 weight % Co were coated with PVD-technique according to the following sequences in one process Version A; a layer stack ($Ti_{0.33}Al_{0.67}N$—$Al_2O_3$—$Ti_{0.33}Al_{0.67}N$—$Al_2O_3$—$Ti_{0.33}Al_{0.67}N$—$Al_2O_3$), Version B; a layer stack ($Ti_{0.33}Al_{0.67}N$—$Al_2O_3$)

Version C; a $Ti_{0.33}Al0.67N$-layer.

The inserts were tested in a dry shoulder milling application.

Work piece material: Martensitic stainless steel X90CrMoV18 (1.4112).

Cutting speed: 140 m/min

Tool life criteria: Number of produced parts

TABLE 1

| Tool life parts produced after edge milling | | |
|---|---|---|
| Coating | | |
| $Ti_{0.33}Al_{0.67}N$ | $Ti_{0.33}Al_{0.67}N$—$Al_2O_3$ | 3 × ($Ti_{0.33}Al_{0.67}N$—$Al_2O_3$) |
| 3 | 4 | 7 |

Tool life parts

The result shows the effect of an increasing layer thickness on tool life in edge milling.

EXAMPLE 2

Cemented carbide inserts P600x-D19R with the composition 90 weight % WC and 10 weight % Co were coated with PVD-technique according to the following sequences in one process Version A: a layer stack $Ti_{0.33}Al_{0.67}N$—$Al_2O_3$—$Ti_{0.33}Al_{0.67}N$—$Al_2O_3$—$Ti_{0.33}Al_{0.67}N$—$Al_2O_3$—ZrN (ZrN blasted off after coating)

Version B: a $Ti_{0.33}Al0.67N$-layer.

The inserts were tested in a drilling operation with coolant.

Work piece material: GG25, grey cast iron, diameter: 19 mm,

Cutting speed 100 m/min,
Rotation speed 1675 rev/min,
Feed per tooth 0.16 mm,
Feed rate 536 mm/min,
Cutting depth 90 mm
Tool life time:
Version A: 95 min
Version B: 42 min The results show the favorable effect of multilayered (Ti,Al)N-Alumina against pure (Ti,Al)N.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

The invention claimed is:

1. A PVD coated cemented carbide insert having an upper face (rake face), an opposite face and at least one clearance face intersecting said upper and opposite faces to define cutting edges wherein the cemented carbide has a composition of from about 86 to about 90 weight % WC, from about 0.2 to about 0.8 weight % $Cr_3C_2$ and from about 10 to about 14 weight % Co, having a grain size of WC of less than about 1.5 μm and wherein the cemented carbide insert is coated with a hard layer system, having a total thickness of from about 3 to about 30 μm, comprising a first layer of (Ti,Al)N with a thickness of from about 1 to about 5 μm, an alumina layer, with a thickness of from about 1 to about 4 μm, a ((Ti,Al)N+alumina)*N multilayer, where N≧2, with a thickness of less than about 0.5 μm, and a ZrN layer with a thickness of less than about 1 μm, the ZrN-layer missing on the rake face and on the edge line.

2. A cutting tool insert of claim 1 wherein there is a thin layer of substoichiometric $ZrN_{1-x}$ underneath the top layer of ZrN.

3. A cutting insert of claim 1 wherein the cemented carbide has a composition of from about 86 to about 87 weight % WC, from about 0.4 to about 0.6 weight % of $Cr_3C_2$ and from about 11 to about 13 weight % of Co.

4. A cutting tool insert of claim 1 wherein the WC in the cemented carbide has a grain size of less than about 1.1 μm.

5. A cutting tool insert of claim 1 wherein said first layer has a thickness of from about 1 to about 2 μm.

6. A cutting tool insert of claim 1 wherein said alumina is γ-alumina.

7. A cutting tool insert of claim 1 wherein said multilayer has a thickness of from about 0.1 to about 0.3 μm.

8. A cutting tool insert of claim 1 wherein said ZrN Layer has a thickness of from about 0.1 to about 0.6 μm.

9. A cutting tool insert of claim 1 wherein the (Ti,Al)N layers have an atomic composition of Ti/Al of greater than about 60/40 to less than about 70/30.

10. A cutting tool insert of claim 1 wherein the (Ti,Al)N layers have an atomic composition of Al/Ti of about 67/33.

11. Method of making a coated cutting tool insert, having an upper face (rake face), an opposite face and at least one clearance face intersecting said upper and opposite faces to define cutting edges comprising:

providing a cemented carbide substrate with a composition of about 86 to about 90 weight % WC, 0.2 to about 0.8 weight % $Cr_3C_2$ and from about 10 to about 14 weight % Co, having a grain size of WC of less than about 1.5 μm, depositing onto the cemented carbide substrate by PVD, a hard layer system with a total thickness of from about 3 to about 30 μm, and comprising a first layer of (Ti,Al)N with a thickness of from about 1 to about 5 μm, an alumina layer with a thickness of from about 1 to about 4 μm, a ((Ti,Al)N+alumina)*N multilayer, where N≧2, with a thickness of less than about 0.5 μm, and an outermost ZrN layer with a thickness of less than about 1 μm, and removing said ZrN-layer on the rake face and on the edge line by post-treatment.

12. Method according to claim 11 further comprising depositing a thin layer of substoichiometric $ZrN_{1-x}$ on top of the ((Ti,Al)N +alumina)*N multilayer.

13. A method of claim 11 wherein the cemented carbide has a composition of from about 86 to about 87 weight % WC, from about 0.4 to about 0.6 weight % of $Cr_3C_2$ and from about 11 to about 13 weight % of Co.

14. A method of claim 11 wherein the WC in the cemented carbide has a grain size of less than about 1.1 μm.

15. A method of claim 11 wherein said first layer has a thickness of from about 1 to about 2 μm.

16. A method of claim 11 wherein said alumina is γ-alumina.

17. A method of claim 11 wherein said multilayer has a thickness of from about 0.1 to about 0.3 μm.

18. A method of claim 11 wherein said ZrN layer has a thickness of from about 0.1 to about 0.6 μm.

19. A method of claim 11 wherein the (Ti,Al)N layers have an atomic composition of Al/Ti of than about 60/40 to less than about 70/30.

20. A method of claim 11 wherein the (Ti,Al)N layers have an atomic composition of Al/Ti of about 67/33.

* * * * *